(12) United States Patent
Dams

(10) Patent No.: US 7,541,699 B2
(45) Date of Patent: Jun. 2, 2009

(54) MAGNET ASSEMBLY, LINEAR ACTUATOR, PLANAR MOTOR AND LITHOGRAPHIC APPARATUS

(75) Inventor: Johannes Adrianus Antonius Theodorus Dams, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 206 days.

(21) Appl. No.: 11/317,233

(22) Filed: Dec. 27, 2005

(65) Prior Publication Data

US 2007/0145831 A1     Jun. 28, 2007

(51) Int. Cl.
*H02K 41/00* (2006.01)
(52) U.S. Cl. ............................................. 310/12; 310/15
(58) Field of Classification Search .................... 310/12, 310/15
See application file for complete search history.

(56) References Cited

U.S. PATENT DOCUMENTS 6,531,793 B1    3/2003   Frissen et al.
6,741,332 B2 *  5/2004   Nishi ........................... 355/72
6,844,695 B2 *  1/2005   Ebihara et al. ............... 318/649
6,943,464 B2 *  9/2005   Hol et al. ....................... 310/12
6,958,808 B2 * 10/2005   Tanaka et al. .................. 355/72
6,998,737 B2 *  2/2006   De Weerdt .................... 310/12
7,016,020 B2 *  3/2006   Munnig Schmidt .......... 355/72

* cited by examiner

*Primary Examiner*—Quyen P Leung
*Assistant Examiner*—Iraj A Mohandesi
(74) *Attorney, Agent, or Firm*—Pillsbury Winthrop Shaw Pittman LLP

(57) ABSTRACT

This invention relates to a magnet assembly that includes a ferromagnetic member extending in a first direction, an array of magnetized poles of opposite polarity arranged adjacent to each other in the first direction and mounted on the ferromagnetic member, wherein a magnetized pole of the array of magnetized poles includes a plurality of permanent magnets arranged to generate a diverging magnetic field towards the ferromagnetic member. In the magnet assembly, each permanent magnet of the magnetized pole has a magnetic polarization having a non-zero component in the first direction and a non-zero component in a second direction substantially perpendicular to the first direction.

10 Claims, 6 Drawing Sheets

PRIOR ART

PRIOR ART

MAGNET ASSEMBLY, LINEAR ACTUATOR, PLANAR MOTOR AND LITHOGRAPHIC APPARATUS

FIELD

The present invention relates to a magnet assembly, a linear actuator, a planar motor and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to displace and position the substrate and/or the patterning device, the lithographic apparatus usually includes a plurality of actuators and/or linear motors. In general, such motors or actuators include a magnet assembly and a coil assembly whereby an interaction between both enables a force to be exerted on an object connected to either the magnet assembly or the coil assembly. In order to improve the efficiency of such motors or actuators, different alternatives for the magnet assembly are disclosed in the art.

One way of improving the efficiency is the introduction of a so-called Halbach configuration of magnets. Compared to a conventional array of permanent magnets arranged to generate an alternating North-South pattern, a Halbach configuration of magnets introduces additional magnets arranged between the alternating North-South pattern. As a result, the magnetic field generated by the magnet assembly can be increased in the area where the coil assembly is arranged. A drawback of the Halbach configuration is that the additional magnets introduce additional costs and additional time to manufacture the magnet assembly. Furthermore, a risk of demagnetization part of the permanent magnets may occur due the introduction of the additional magnets.

SUMMARY

It is therefore desirable to provide an improved magnet assembly.

According to an embodiment of the invention, there is provided a magnet assembly including a ferromagnetic member extending in a first direction; an array of magnetized poles of alternating polarity arranged adjacent to each other in the first direction and mounted on the ferromagnetic member, a magnetized pole of said array of magnetized poles including a plurality of permanent magnets arranged to generate a diverging magnetic field towards the ferromagnetic member, wherein each permanent magnet of the magnetized pole has a magnetic polarization having a non-zero component in the first direction and a non-zero component in a second direction substantially perpendicular to the first direction.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
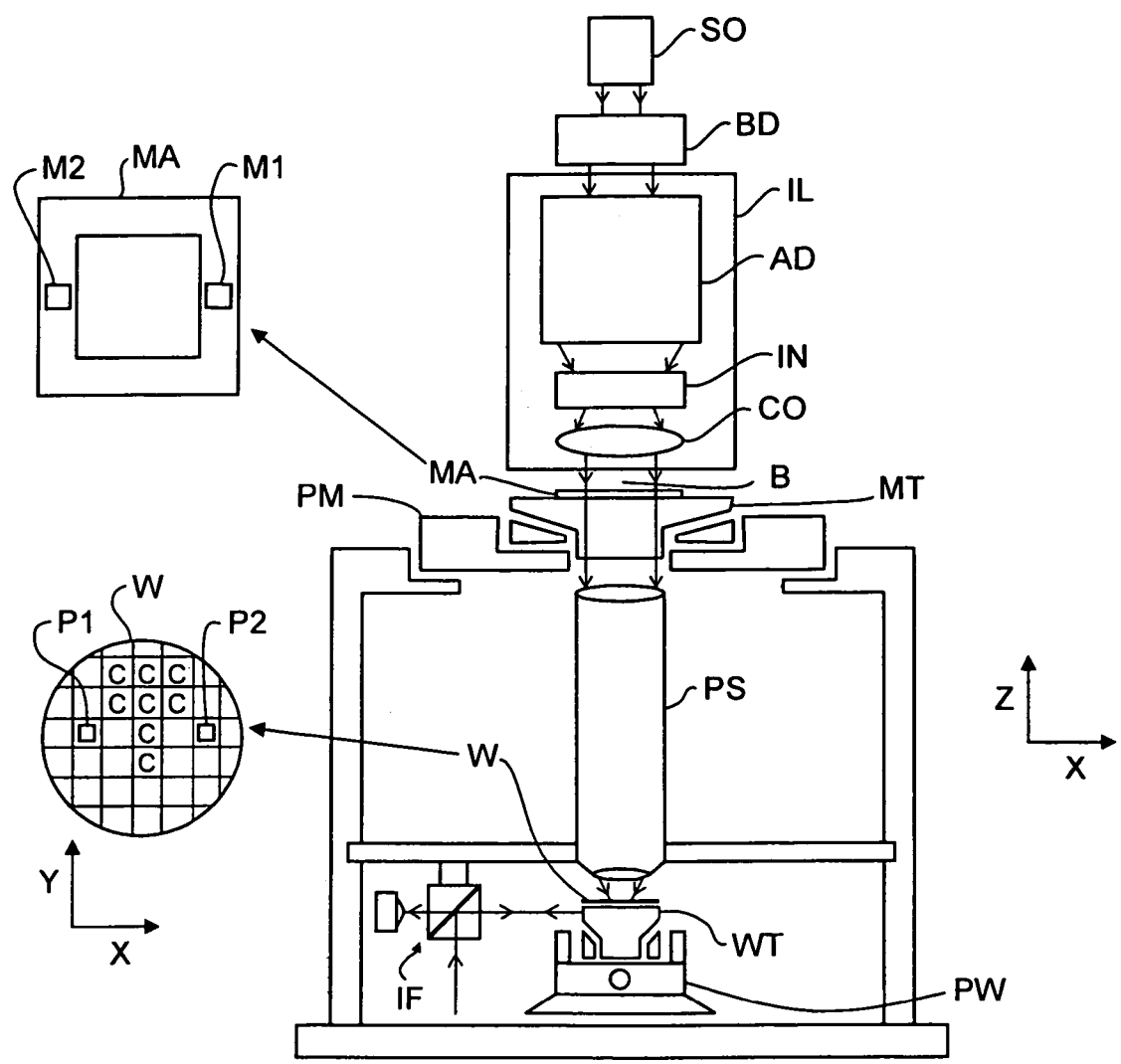
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
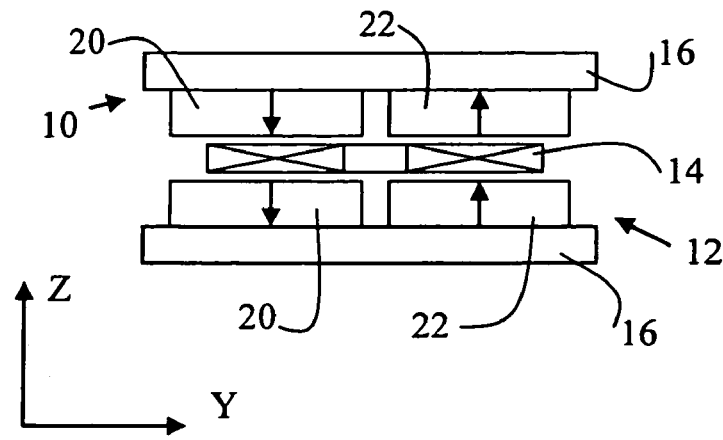
FIG. 2 schematically depicts a conventional linear actuator.

FIG. 2 schematically depicts a conventional linear actuator including a first and a second magnet assembly 10, 12 and a coil 14 arranged between the magnet assemblies. Each magnet assembly includes a ferromagnetic yoke 16 and two permanent magnets 20, 22 arranged adjacent to each other in a first direction (Y-direction). The (magnetic) polarization of the permanent magnets (indicated by the arrows inside the magnets) is directed in a second direction (Z-direction), substantially perpendicular to the first direction. The magnet assemblies form a closed magnetic circuit including the permanent magnets and the ferromagnetic yokes.

Figure 3A:
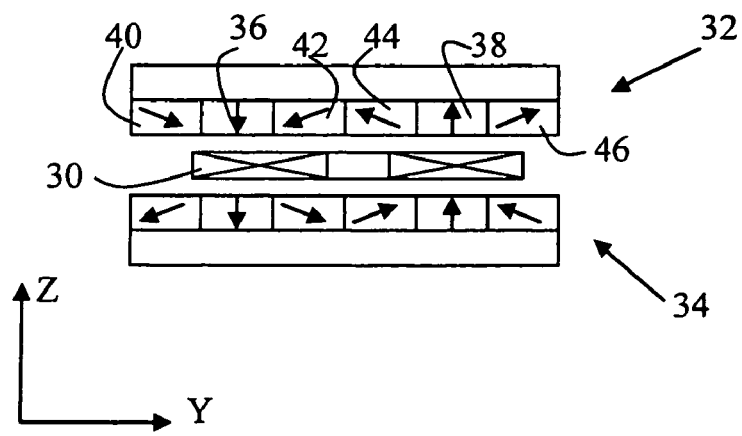
FIGS. 3a and 3b schematically depict a linear actuator including a permanent magnet array in a Halbach configuration.
Figure 3B:
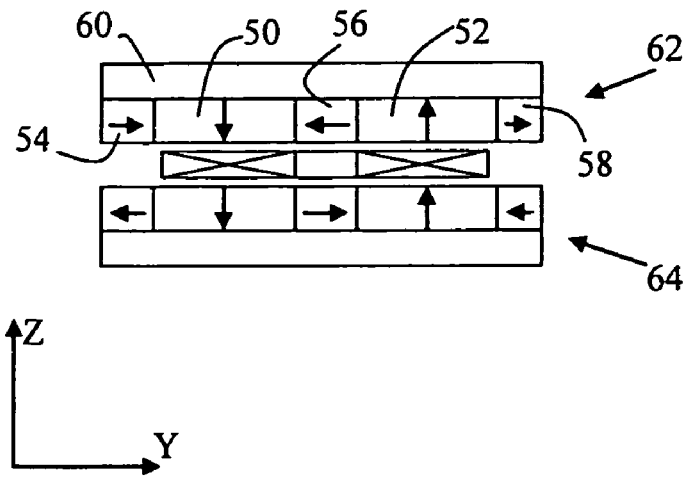

An alternative magnet configuration as known in the art is shown in FIG. 3a. FIG. 3a schematically depicts an actuator including a coil 30 enclosed by two magnet assemblies 32 and 34 including an array of permanent magnets arranged adjacent to each other in a first direction (Y-direction). Each array of permanent magnets includes two magnets 36, 38 having a magnetic polarization in a second direction (Z-direction) substantially perpendicular to the first direction and additional magnets 40, 42, 44 and 46 thereby forming a so-called Halbach array of permanent magnets. In the Halbach array, each magnetic pole of each magnet assembly consists of three permanent magnets (magnets 36, 40 and 42 are forming one pole, magnets 38, 46 and 48 are forming an adjacent pole of opposite polarity) whereby the magnets are arranged in such manner that the resulting magnetic field diverges on one side of the magnet array, where the ferromagnetic yoke is located and as a consequence, converges on the opposite side of the magnet array, i.e. the open side of the magnet array, where the coil 30 is located. Due to the introduction of the additional magnets, the magnetic field can be increased between the magnet assemblies and can be decreased in the ferromagnetic yokes. Because the magnets are arranged to form converging magnetic poles towards the open end of the magnet array, the magnetic flux density on the open side of the magnet array is increased. As a consequence, the efficiency of the actuator can be improved and/or the ferromagnetic yoke can be made thinner. FIG. 3b shows an alternative arrangement wherein each of the magnet assemblies 62, 64 includes a ferromagnetic yoke 60, a pair of magnets 50, 52 having a polarization in the Z-direction and three additional magnets 54, 56, 58 to obtain the Halbach configuration.

In the magnet assembly according to a first embodiment of the present invention (FIG. 4) the magnet assembly 80 includes an array of four permanent magnets 72, 74, 76 and 78 and a ferromagnetic yoke 70 arranged on one side of the array of magnets. The four permanent magnets 72, 74, 76 and 78 each have a magnetic polarization direction having a component in the first direction and a component in the second direction substantially perpendicular to the first direction thereby forming a pair of magnetic poles of alternating polarity, i.e. consisting of a South pole (formed by the magnets 72 and 74) and a North pole (formed by the magnets 76 and 78). The magnetic polarization of the permanent magnets is indicated in the permanent magnet by an arrow, by convention, the arrowhead designates the North pole of the permanent magnet. The magnets are arranged in such manner that the magnetic flux generated by the magnets forming a pole diverges towards the ferromagnetic yoke and therefore converges towards the open side of the magnet array, i.e. the side opposite the ferromagnetic yoke. Simulations show that such an arrangement of permanent magnets may result in a comparable improvement of the magnetic field compared to an arrangement using a Halbach configuration while requiring less magnets than the arrangements shown in FIGS. 3a and 3b. One of the benefits of this is that the alternating magnetic poles can be generated in the same space requiring less and less thin magnets. Because of the decreased number of magnets the cost of magnets in terms of sawing and coating may also decrease. Because magnets are brittle it may be desirable to use larger magnets. The actual amount of magnetic material may also increase when the number of magnets is reduced since tolerances and coating thickness of the magnets may take up some of the space that is available. The magnet assembly as shown is applied in a linear actuator further including a coil assembly including a coil 82 and a second magnet assembly 84, similar to the magnet assembly 80, both magnet assemblies substantially encompassing the coil assembly.

Figure 4:
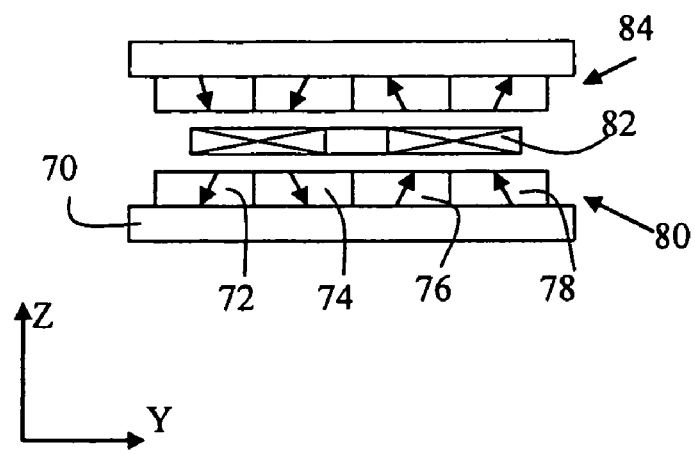
FIG. 4 schematically depict a first linear actuator including a magnet assembly according to an embodiment of the present invention.

Comparing FIG. 4 with the arrangement shown in FIG. 2, it should be noted that the adjacent magnet 20 and 22 in FIG. 2 have a polarization substantially parallel to the second direction, whereas the polarization of the magnets 74 and 76 is such that a non-zero angle exists between the polarization of the magnets and the second direction. By introducing this angle, the short-circuiting of magnetic flux (either from magnet 20 to magnet 22 in FIG. 2 or from magnet 74 to magnet 76 in FIG. 4) can be reduced. As a consequence, the magnetic flux that is imparted by the coil can be increased, resulting in an improved efficiency of the actuator. The reduced short-circuiting may also reduce the forces generated in de Z-direction which occur when the coil assembly is not exactly placed in the middle between magnet assembly 80 and 84. This is a benefit since these parasitic forces might reduce the ability to accurately move an object.

Figure 5A:
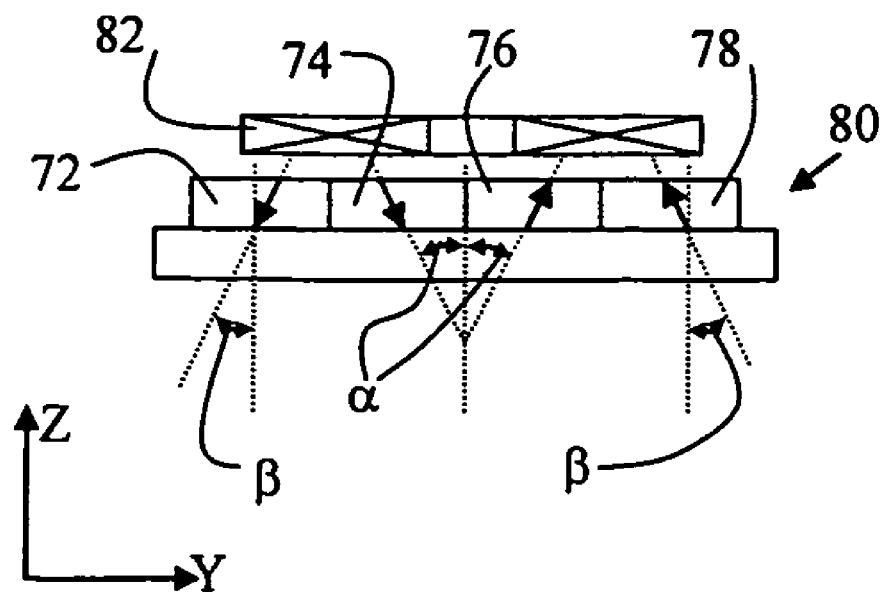
FIG. 5a schematically depicts a second linear actuator including a magnet assembly according to an embodiment of the present invention.

It should be noted that the magnet assemblies according to embodiments of the present invention may also be applied in a linear actuator having only a magnet assembly on one side of the coil(s) rather than having a magnet assembly on both sides. An example of such a single sided actuator is shown in FIG. 5a. FIG. 5a schematically depicts the magnet assembly 80 of FIG. 4 together with the coil 82. Such an arrangement also results in a linear actuator that e.g. can be applied in a lithographic apparatus for displacing an object table or an optical element. In FIG. 5a, the non-zero angle between the polarization of the innermost magnets 74 and 76 and the second direction is designated by $\alpha$, $\beta$ is used to indicate the non-zero angle between the polarization of the outermost magnets 72 and 78 and the second direction. Similar considerations are valid for the non-zero angle $\beta$ of the magnetic polarization of the magnets 72 and 78; due to the introduction of this angle, the magnetic flux density in the operating area of the coil can be increased.

Figure 5B:
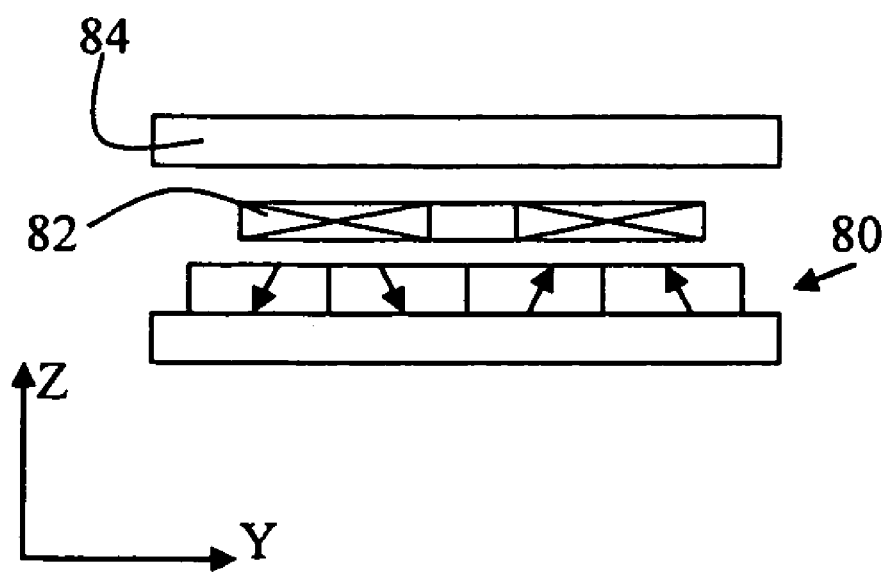
FIG. 5b schematically depicts a third linear actuator including a magnet assembly according to an embodiment of the present invention.

In order to improve the magnetic flux density imparting the coil, the actuator as shown in FIG. 5a can be equipped with a ferromagnetic member 84, arranged as shown in FIG. 5b. Due to the introduction of the ferromagnetic member 84, the magnetic resistance can be reduced, resulting in an increased flux density imparting the coil.

In an embodiment of the present invention, angles α and β are chosen to be substantially equal. In such an arrangement, the magnet array can be constructed using only one type of magnet.

Such an arrangement can be beneficially applied to obtain a magnet assembly for a linear motor. Whereas a linear actuator usually includes a small number of pole-pairs in the magnet array (often only one), a linear motor usually includes a larger number of pole-pairs. In such motors, a symmetrical arrangement may be preferred.

In an embodiment of the present invention, angles α and β are selected to be smaller than about 45°. As such, an absolute value of the magnetic polarization component in the first direction is smaller than an absolute value of the magnetic polarization component in the second direction, for each magnet.

In an embodiment of the present invention, angle β is selected to be substantially larger than angle α. Such an arrangement provides a further increase in the magnetic flux density in the operating area of the coil. In a preferred embodiment, angle α is selected to be approximately 10°-20°, whereas angle β is approximately 30°-40°. In such an arrangement, the magnetic flux density in the operating area of the coil may exceed the flux density obtained by both conventional magnet assemblies as shown in FIG. 2 and assemblies as shown in FIGS. 3a and 3b.

It should further be noted that the magnet assembly according to embodiments of the present invention can be less susceptible to demagnetization compared to conventional magnet assemblies as described in the art. In particular the magnet assemblies that include a Halbach configuration (as e.g. shown in FIGS. 3a and 3b) can be susceptible to demagnetization. In order to overcome or mitigate this effect, the use of different grades of magnets may be required when a Halbach configuration is used. As will be appreciated by a person skilled in the art, a proper selection of the type of magnet that is used, is often a trade-off between different requirements such as providing a high flux density, avoiding demagnetization, temperature resistance, etc. . . . Assessing the currently available permanent magnets, one can notice a conflict between the requirement of providing a high flux density and the requirements of providing a resistance against demagnetization or increased temperature. Therefore, in case a Halbach configuration is adopted (see e.g. the configurations of FIGS. 3a and 3b), one may have to select permanent magnets for all or part of the magnet assembly providing a lower flux density (in order to avoid or mitigate demagnetization effects) compared to the permanent magnets that can be selected in the magnet assemblies according to embodiments of the present invention.

Figure 6A:
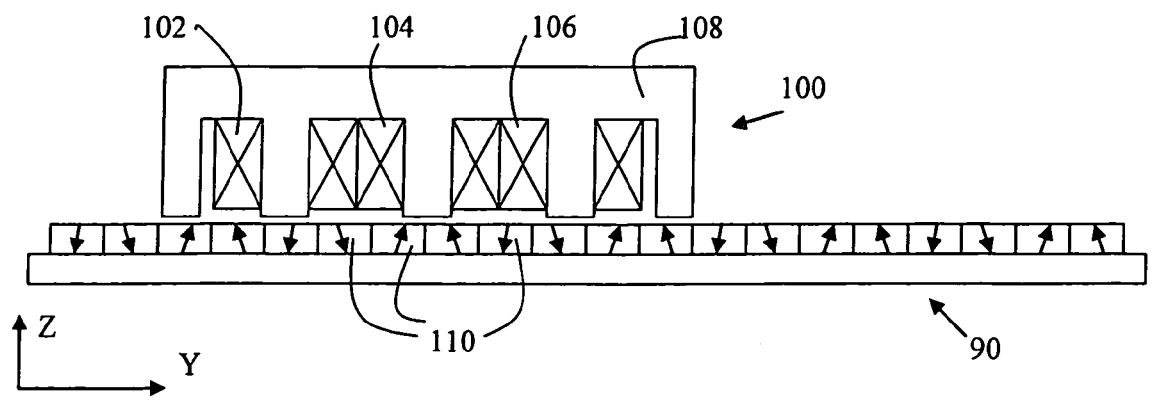
FIG. 6a schematically depicts a linear motor including a magnet assembly according to an embodiment of the present invention.

A magnet assembly according to an embodiment of the present invention may be applied in a linear motor such as a three-phase linear motor. A magnet assembly according to an embodiment of the present invention can be applied in such a motor thereby enabling an efficiency increase. An example of such an arrangement is schematically depicted in FIG. 6a. The arrangement as shown schematically depicts a magnet assembly 90 including a plurality of pole pairs arranged on a ferromagnetic member and a coil assembly 100 including three coils 102, 104 and 106 arranged adjacent to each other in the Y-direction. In the arrangement as shown, the coils are mounted on a ferromagnetic member 108. The ferromagnetic member 108 provides a low-resistance path for the magnetic flux generated by the permanent magnets 110 of the magnet assembly. As a result, a high flux density can be obtained in the airgap between the coil assembly and the magnet assembly enabling a high efficiency of the linear motor. In order to reduce the weight of the coil assembly, the ferromagnetic member can be omitted.

Figure 6B:
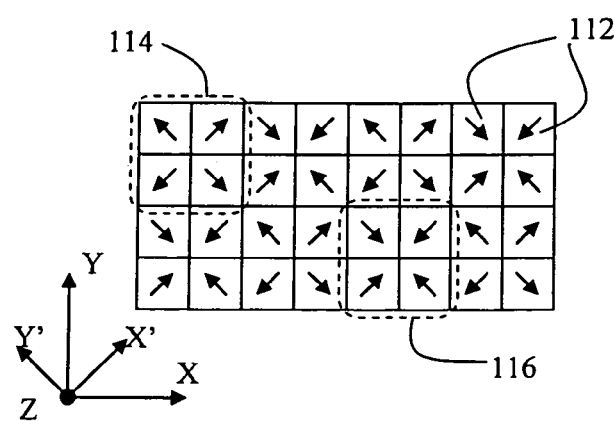
FIG. 6b schematically depicts a magnet assembly according to an embodiment of the present invention for use in a planar motor.

The magnet assembly according to an embodiment of the present invention may equally be applied in a planar motor. In such an arrangement, the magnet assembly includes a two-dimensional array of permanent magnets arranged to generate a two-dimensional magnetic field distribution of North and South poles. In such an arrangement, each pole may consist of four permanent magnets arranged to generate alternating North and South poles in both dimensions. Each magnet may have a magnetic polarization component in the two-dimensional plane and a component in a direction perpendicular to the two-dimensional plane. FIG. 6b schematically depicts such a magnet arrangement.

FIG. 6b schematically depicts a two-dimensional array of permanent magnets 112 arranged to form an alternating distribution of North and South poles, each pole consisting of four magnets (e.g. the four magnets enclosed by the contour 114 or the contour 116). In a preferred embodiment, the four magnets are arranged in a square. The arrows schematically depict the component of the magnetic polarization that is directed in the two-dimensional plane (XY-plane). Each magnet may further have a magnetic polarization component in a direction perpendicular to the XY-plane (Z-direction). As an example, all magnets that are part of a North-pole may have (in addition to the component in the XY-plane) have a magnetic polarization component in the positive Z-direction, while all magnets that are part of a South-pole may have (in addition to the component in the XY-plane) have a magnetic polarization component in the negative Z-direction. Because of the magnetic polarization component in the XY-plane, such an arrangement also results in a magnetic field distribution that diverges to one side (e.g. the positive Z-direction) and converges towards the opposite side (e.g. the negative Z-direction).

By mounting the permanent magnets on a ferromagnetic member extending in the XY-plane such that the diverging magnetic field is directed towards the ferromagnetic member, the same benefits can be obtained as in a linear magnet assembly according to an embodiment of the invention. Such a two-dimensional magnet assembly may be applied in a planar motor. In addition to the two-dimensional magnet assembly, such a planar motor includes a coil assembly that, in general, includes a plurality of coils arranged in a plane parallel to the magnet assembly such that, when the coils are energized, a force is generated due to the interaction of the coil assembly and the magnet assembly, the force enabling both assemblies to displace relative to each other. Operation and lay-out of a conventional planar motor can e.g. be found in U.S. Pat. No. 6,531,793.

In order to provide a substantially frictionless movement of both assemblies relative to each other, a gas bearing (e.g. an air bearing) can be provided between the assemblies. Alternatively, or in combination, the coils of the coil assembly may also be energized in such manner such that a gap between both assemblies is maintained by electromagnetic forces generated by the motor in a direction perpendicular to the two-dimensional plane of motion ensuring a substantially frictionless motion. In an embodiment of such a planar motor, the coil assembly may include one or more sets of coils arranged in a plane parallel to the magnet assembly, the coils extending along the X'-axis as indicated in FIG. 6b and one or more sets of coils, the coils extending along the Y'-axis in order to enable a two-dimensional displacement of the coil assembly relative to the magnet assembly.

Figure 7:
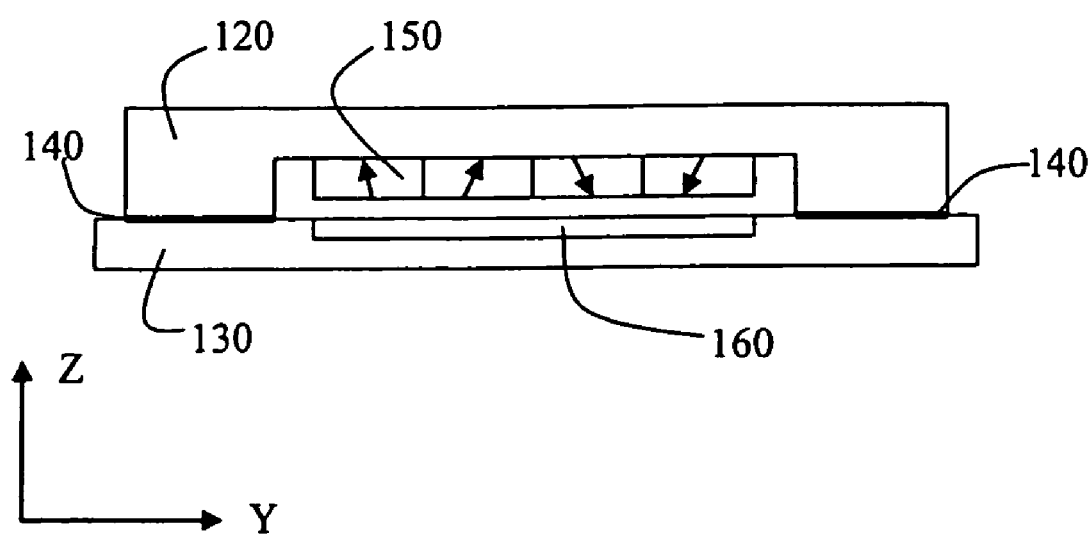
FIG. 7 schematically depicts a magnet assembly according to an embodiment of the present invention applied in a bearing arrangement.

It should further be noted that embodiments of the present invention may also be applied in other applications. An example of such an application is an arrangement providing a pre-tension force for a gas bearing (e.g. an air bearing). Such an arrangement may include a magnet assembly according to an embodiment of the present invention that co-operates with a ferromagnetic member to provide a pre-tensioning force. FIG. 7 schematically depicts such an arrangement. The arrangement shown in FIG. 7 includes a first part 120 that is displaceable relative to a second part 130, substantially without friction due to the presence of a gas bearing 140 between both parts. The arrangement further includes a magnet assembly 150 according to an embodiment of the present invention, the magnet assembly being arranged on the first part and co-operating with a ferromagnetic part 160 that is mounted on the second part to provide a pre-load force for the gas bearing (in the arrangement as shown, the pre-load force will substantially be directed in the Z-direction). Alternatively, in case the second part is made of, or includes, ferromagnetic material, the second part itself may co-operate with the magnet assembly in order to provide the pre-load force.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a patterning device support constructed to support a patterning device, the patterning device being capable of imparting a radiation beam with a pattern in its cross-section to form a patterned radiation beam;
   a substrate support constructed to hold a substrate;
   a projection system configured to project the patterned radiation beam onto a target portion of the substrate, and
   an actuator configured to position one of the supports, the actuator including
      a magnet assembly comprising:
         a ferromagnetic member extending in a first direction;
         an array of magnetized poles of alternating polarity arranged adjacent to each other in the first direction and mounted on the ferromagnetic member, and
         a magnetized pole of said array of magnetized poles comprising a plurality of permanent magnets arranged to generate a diverging magnetic field towards the ferromagnetic member, each permanent magnet of said magnetized pole has a magnetic polarization having a non-zero component in the first direction and a non-zero component in a second direction substantially perpendicular to the first direction, and
      a coil assembly constructed and arranged to co-operate with the magnet assembly.

2. An apparatus according to claim 1, wherein said magnetized pole consists of two permanent magnets.

3. An apparatus according to claim 2, wherein said array of magnetized poles consists of two poles of opposite polarity and includes an array of four permanent magnets arranged adjacent to each other in the first direction.

4. An apparatus according to claim 3, wherein the absolute value of the non-zero component in the first direction of the two innermost magnets is larger than the absolute value of the non-zero component in the first direction of the two outermost magnets.

5. An apparatus according to claim 2, wherein the absolute value of the non-zero component in the first direction is the same for each magnet and the absolute value of the non-zero component in the second direction is the same for each magnet.

6. An apparatus according to claim 3, wherein the absolute value of the non-zero component in the second direction is larger than the absolute value of the non-zero component in the first direction, for each of the permanent magnets.

7. An apparatus according to claim 1, wherein the array of magnetized poles of alternating polarity is a two-dimensional array extending in a third direction substantially perpendicular to the first direction and the second direction.

8. An apparatus according to claim 7, wherein said magnetized pole consists of four permanent magnets, arranged in a square.

9. An apparatus according to claim 1, wherein adjacent magnetized poles of the array of magnetized poles have opposite polarity.

10. A lithographic apparatus comprising:
- a patterning device support constructed to support a patterning device, the patterning device being capable of imparting a radiation beam with a pattern in its cross-section to form a patterned radiation beam;
- a substrate support constructed to hold a substrate;
- a projection system configured to project the patterned radiation beam onto a target portion of the substrate, and
- an actuator configured to position one of the supports, the actuator including
  a magnet assembly comprising:
  - a ferromagnetic member extending in a first direction;
  - a plurality of adjacent permanent magnets arranged to generate a diverging magnetic field towards the ferromagnetic member, each permanent magnet of said magnetized pole having a magnetic polarization having a non-zero component in the first direction and a non-zero component in a second direction substantially perpendicular to the first direction, and
  a coil assembly constructed and arranged to co-operate with the magnet assembly.

* * * * *